United States Patent [19]
Shirley et al.

US005875141A

[11] Patent Number: 5,875,141
[45] Date of Patent: Feb. 23, 1999

[54] CIRCUIT AND METHOD FOR A MEMORY DEVICE WITH P-CHANNEL ISOLATION GATES

[75] Inventors: Brian M. Shirley; Stephen L. Casper, both of Boise, Id.

[73] Assignee: Micron Technology, Inc., Boise, Id.

[21] Appl. No.: 911,074

[22] Filed: Aug. 14, 1997

[51] Int. Cl.$^6$ .............................. G11C 7/02; G11C 7/00
[52] U.S. Cl. .................. 365/207; 365/208; 365/190; 365/226
[58] Field of Search ...................... 365/205, 207, 365/208, 230.05, 190, 226

[56] References Cited

U.S. PATENT DOCUMENTS

| | | | |
|---|---|---|---|
| 4,807,195 | 2/1989 | Busch et al. | 365/207 |
| 4,897,568 | 1/1990 | Chern et al. | 307/530 |
| 4,991,142 | 2/1991 | Wang | 365/208 |
| 5,029,136 | 7/1991 | Tran et al. | 365/205 |
| 5,315,555 | 5/1994 | Choi | 365/207 |
| 5,636,170 | 6/1997 | Seyyedy | 365/207 |
| 5,680,364 | 10/1997 | Lee | 365/230.05 |
| 5,689,461 | 11/1997 | Kaneko et al. | 365/207 |

*Primary Examiner*—David Nelms
*Assistant Examiner*—Trong Phan
*Attorney, Agent, or Firm*—Schwegman, Lundberg, Woessner & Kluth, P.A.

[57] ABSTRACT

A circuit and method for limiting voltage swing on the complementary bit lines of a memory device. Complementary bit lines of the memory device are coupled to a sense amplifier through first and second p-channel isolation devices. A low voltage is applied to a gate of the p-channel isolation devices to activate the p-channel isolation devices such that one of the first and second p-channel isolation devices establishes the low logic level on one of the complementary bit lines at a voltage that limits the swing on the complementary bit lines.

20 Claims, 2 Drawing Sheets

CIRCUIT AND METHOD FOR A MEMORY DEVICE WITH P-CHANNEL ISOLATION GATES

TECHNICAL FIELD OF THE INVENTION

The present invention relates generally to the field of electronic circuits and, in particular, to a circuit and method for a memory device with p-channel isolation gates.

BACKGROUND OF THE INVENTION

Electronic systems typically store data during operation in a memory device. In recent years, the dynamic random access memory (DRAM) has become a popular data storage device for such systems. Basically, a DRAM is an integrated circuit that stores data in binary form (e.g., "1" or "0") in a large number of cells. The data is stored in a cell as a charge on a capacitor located within the cell. Typically, a high logic level is approximately equal to the power supply voltage and a low logic level is approximately equal to ground.

The cells of a conventional DRAM are arranged in an array so that individual cells can be addressed and accessed. The array can be thought of as rows and columns of cells. Each row includes a word line that interconnects cells on the row with a common control signal. Similarly, each column includes a bit line that is coupled to at most one cell in each row. Thus, the word and bit lines can be controlled so as to individually access each cell of the array.

To read data out of a cell, the capacitor of a cell is accessed by selecting the word line associated with the cell. A complementary bit line that is paired with the bit line for the selected cell is equilibrated with the voltage on the bit line for the selected cell. This equilibration voltage is typically midway between the high and low logic levels. Thus, conventionally, the bit lines are equilibrated to one-half of the power supply voltage, $V_{cc}/2$. When the word line is activated for the selected cell, the capacitor of the selected cell discharges the stored voltage onto the bit line, thus changing the voltage on the bit line.

A sense amplifier detects and amplifies the difference in voltage on the pair of bit lines. The sense amplifier typically includes two main components: an n-sense amplifier and a p-sense amplifier. The n-sense amplifier includes a cross-coupled pair of n-channel transistors in which the gates of the transistors are coupled to the bit lines. Thus, during a read operation, the n-channel devices are initially driven by the equilibration voltage on the bit lines. The n-sense amplifier is used to drive the low bit line to ground. The p-sense amplifier includes a cross-coupled pair of p-channel transistors and is used to drive the high bit line to the power supply voltage.

An input/output device for the array, typically an n-channel transistor, passes the voltage on the bit line for the selected cell to an input/output line for communication to, for example, a processor of a computer or other electronic system associated with the DRAM. In a write operation, data is passed from the input/output lines to the bit lines by the input/output device of the array for storage on the capacitor in the selected cell.

Each of the components of a memory device are conventionally formed as part of an integrated circuit. To more effectively use the surface area of the integrated circuit, the memory array may include sub-arrays which share some portions of the sense amplifier circuitry. In such memory devices, the sub-arrays are coupled to the sense amplifier through an isolation transistor, typically an n-channel transistor. By using the n-channel isolation transistor, the sense amplifier can pull the low bit line to ground with no threshold voltage loss. The high bit line is pulled to the power supply voltage by a p-sense amplifier that is directly located on the bit line or by a p-sense amplifier that is located inside the n-channel isolation transistors. In the latter case, the voltage on the gate of the n-channel transistor is brought to a voltage above the power supply to allow full charging of the high bit line.

One problem with DRAM design relates to limiting the power consumption of the memory device. One way to reduce power consumption is to lower the power supply voltage for the memory device. Unfortunately, by reducing the power supply voltage, the equilibration voltage is also reduced since the equilibration voltage is typically midway between the power supply and ground. As explained above, the equilibration voltage provides the drive to operate the n-sense amplifier. Thus, the effectiveness of the equilibration voltage in driving the n-sense amplifier is reduced as the power supply, and consequently the equilibration voltage, is reduced. As the equilibration voltage gets close to the threshold voltage of the n-channel transistors of the n-sense amplifier, it becomes slower and more difficult to turn on the n-sense amplifier.

For the reasons stated above, and for other reasons stated below which will become apparent to those skilled in the art upon reading and understanding the present specification, there is a need in the art for a memory device and method that provide acceptable operation at lower power supply levels.

SUMMARY OF THE INVENTION

The above-mentioned problems with memory devices and other problems are addressed by the present invention and which will be understood by reading and studying the following specification. A memory device and method are described which use p-channel transistors to isolate memory banks from a shared sense amplifier. These p-channel transistors limit the voltage swing on the bit lines of an active memory bank which allows a higher equilibration voltage to be applied to the sense amplifier, even as the power supply voltage of the memory device is reduced when compared to conventional voltage levels.

In particular, an illustrative embodiment of the present invention includes a method for limiting voltage swing of the complementary bit lines of the memory device. The method includes coupling complementary bit lines of the memory device to a sense amplifier through first and second p-channel isolation devices. Further, a low voltage is applied to a gate of the p-channel isolation devices so as to activate the p-channel isolation devices. In this manner, one of the first and second p-channel isolation devices establishes the low logic level on one of the complementary bit lines at a voltage that limits the swing on the complementary bit lines.

In another embodiment, a method for reading and writing data in a memory device having first and second sub-arrays and a shared sense amplifier is provided. The method includes isolating one of the first and second sub-arrays from the sense amplifier with a first pair of p-channel isolation transistors coupled between complementary bit lines and the sense amplifier. Additionally, the other of the first and second sub-arrays is coupled to the sense amplifier with a second pair of p-channel isolation transistors. The p-channel isolation transistors couple complementary bit lines of the sub-array with the sense amplifier. Data is selectively read from and written to selected cells through the p-channel isolation transistors that are coupled to the non-isolated sub-array. Further, a low logic level is established on one of the bit lines of the non-isolated sub-array. This low logic level for the bit lines is different from the low logic level of the sense amplifier. In one embodiment, the step of establishing a low logic level comprises the step of establishing a low logic level that is above the low logic level of the sense amplifier by approximately a threshold voltage of the p-channel isolation transistor.

In another embodiment, a method for reading data from a cell of a memory device is provided. The method equilibrates the voltage on a pair of complementary bit lines of an array of the memory device to a voltage level that is approximately half of the difference between low and high logic levels for the memory cell. An access transistor of a selected memory cell is activated so as to share charge with the bit line of the complementary pair. P-channel isolation transistors pass the voltages from the complementary bit lines to a sense amplifier. The sense amplifier is controlled with control signals so as to amplify the effect of this charge shared with the bit line such that complementary nodes of the sense amplifier are driven to high and low logic levels based on the data stored in the selected memory cell. In this embodiment, the high and low logic levels for the complementary bit lines are different from the high and low logic levels for the sense amplifier so as to allow a higher equilibration voltage for a given power supply voltage.

In another embodiment, a method for establishing a low logic level for a cell of a memory device is provided. The method drives complementary nodes of a sense amplifier to high and low logic levels based on the data for the cell so as to latch the data. Nodes of the sense amplifier are coupled to bit lines through first and second p-channel transistors. The method provides for converting the low logic level of the sense amplifier to a different, higher voltage level for the bit lines of the memory device using the p-channel transistors such that the bit lines are equilibrated to a voltage above the midpoint between the high and low logic levels of the sense amplifier. This provides a higher drive voltage for the sense amplifier for a given power supply voltage.

In another embodiment, a memory device is provided. The memory device includes first and second sub-arrays of memory cells. Each sub-array includes a number of bit lines and a number of word lines with memory cells located at selected intersections of the bit and word lines. The memory device also includes a sense amplifier wherein at least a portion of the sense amplifier is shared by the first and second sub-arrays. A number of p-channel isolation transistors are coupled to a bit line in a node of the shared sense amplifier. The p-channel isolation transistors are controlled to establish a low logic level on the bit line at a voltage that limits the swing on the bit lines.

In another embodiment, an apparatus is provided. The apparatus includes an electronic system coupled to a memory device. The memory device includes sub-arrays that are coupled to a shared sense amplifier through p-channel isolation transistors. The p-channel isolation transistors are controlled to establish a low logic level for the sub-arrays at a voltage that limits the swing on bit lines of the sub-array. Thus, the memory device can operate at lower power supply voltages compared to conventional memory devices.

BRIEF DESCRIPTION OF THE INVENTION

FIG. 1 is a block diagram of an illustrative embodiment of a memory device coupled to an electronic system according to the teachings of the present invention; and FIG. 2 is a schematic diagram of an embodiment of a sense amplifier circuit coupled between first and second memory banks according to the teachings of the present invention.

DETAILED DESCRIPTION OF THE INVENTION

In the following detailed description, reference is made to the accompanying drawings which form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Figure 1:
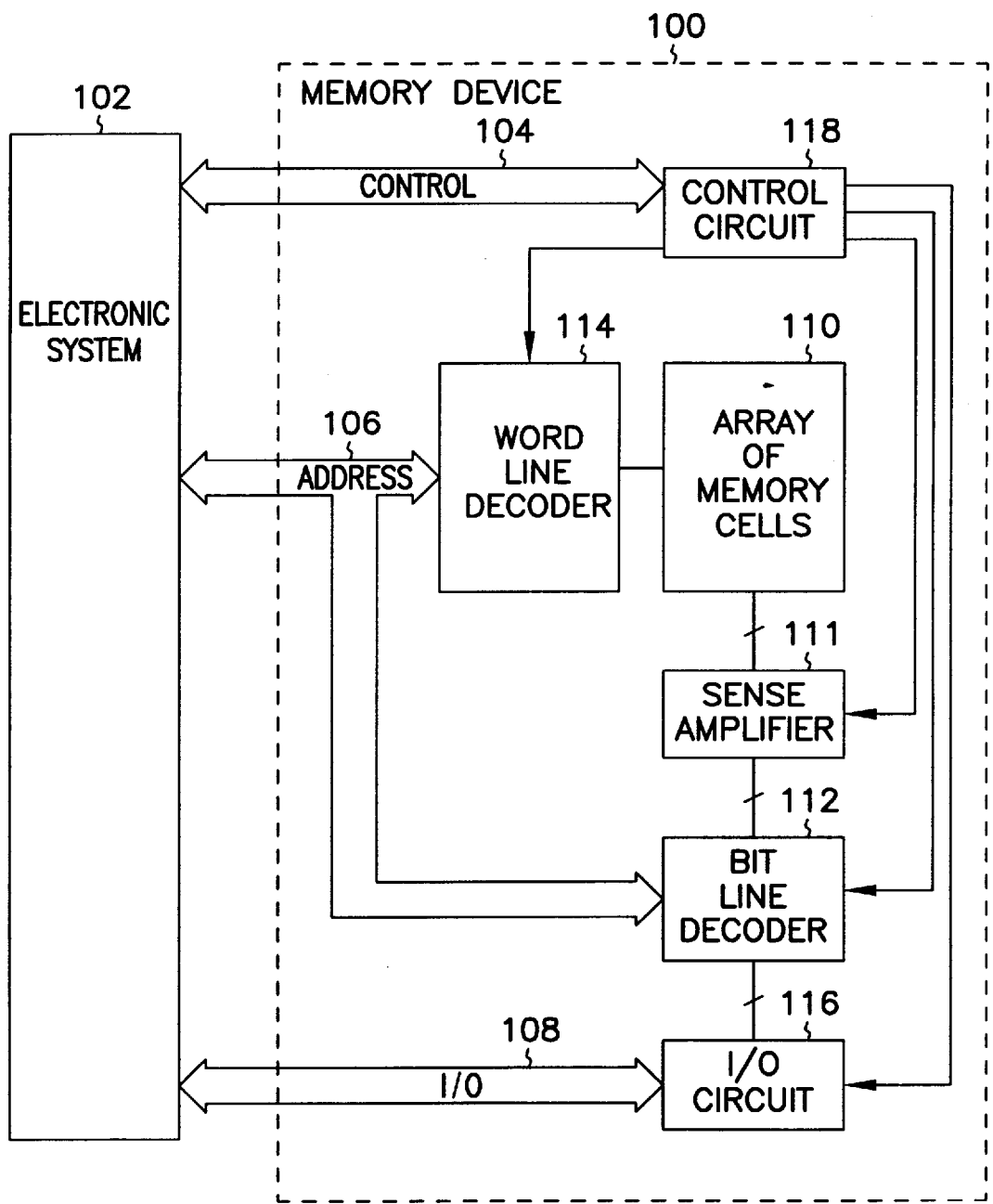

FIG. 1 is a block diagram of an illustrative embodiment of the present invention. This embodiment includes memory device 100 that is coupled to electronic system 102 by control lines 104, address lines 106 and input/output (I/O) lines 108. Electronic system 102 comprises, for example, a microprocessor, a processor based computer, microcontroller, memory controller, a chip set or other appropriate system for reading and writing data in a memory device. Memory device 100 includes array of memory cells 110 that is coupled to word line decoder 114 and sense amplifier 111. Array of memory cells 110 is constructed of at least two sub-arrays that share common circuitry of sense amplifier 111. In this embodiment, the sub-arrays are coupled to sense amplifier 111 through p-channel isolation transistors.

Word line decoder 114 includes word line drivers that are coupled to word lines of array 110. Sense amplifier 111 is coupled to bit line decoder 112. Bit line decoder 112 and word line decoder 114 are coupled to address lines 106. Bit line decoder 112 is coupled to I/O circuit 116. I/O circuit 116 is coupled to I/O lines 108. Control circuit 118 is coupled to control lines 104, sense amplifier 111, word line decoder 114, bit line decoder 112, and I/O circuit 116.

In operation, electronic system 102 provides signals on address lines 106 and control lines 104 when data is to be read from or written to a cell of array 110. Word line decoder 114 determines the word line of a selected cell of array 110 using the address provided on address lines 106. Further, bit line decoder 112 determines the bit line of the selected cell of array 110. In a read operation, sense amplifier 111 detects the value stored in the selected cell based on bit lines of array 110. Sense amplifier 111 provides this voltage to I/O circuit 116 which, in turn, passes data to electronic system 102 over I/O lines 108. In a write operation, I/O circuit 116 passes data from I/O lines 108 to sense amplifier 112 for storage in the selected cell of array 110.

Array 110 of this embodiment advantageously uses a different, higher low logic voltage than sense amplifier 111. The use of a higher low logic voltage in array 110 allows a higher equilibration voltage for a given high logic value or power supply voltage. Thus, as the power supply voltage is reduced, a memory device constructed according to the teachings of the present invention will provide a higher equilibration voltage for a given power supply voltage when compared with conventional DRAMs. The equilibration voltage is used to initially turn on the sense amplifier and must provide a sufficiently high voltage in order to do so. Thus, by providing a higher equilibration voltage for a given power supply voltage, this embodiment of the present invention allows use of the memory device with lower power supply voltages than would work with conventional memory devices.

Figure 2:
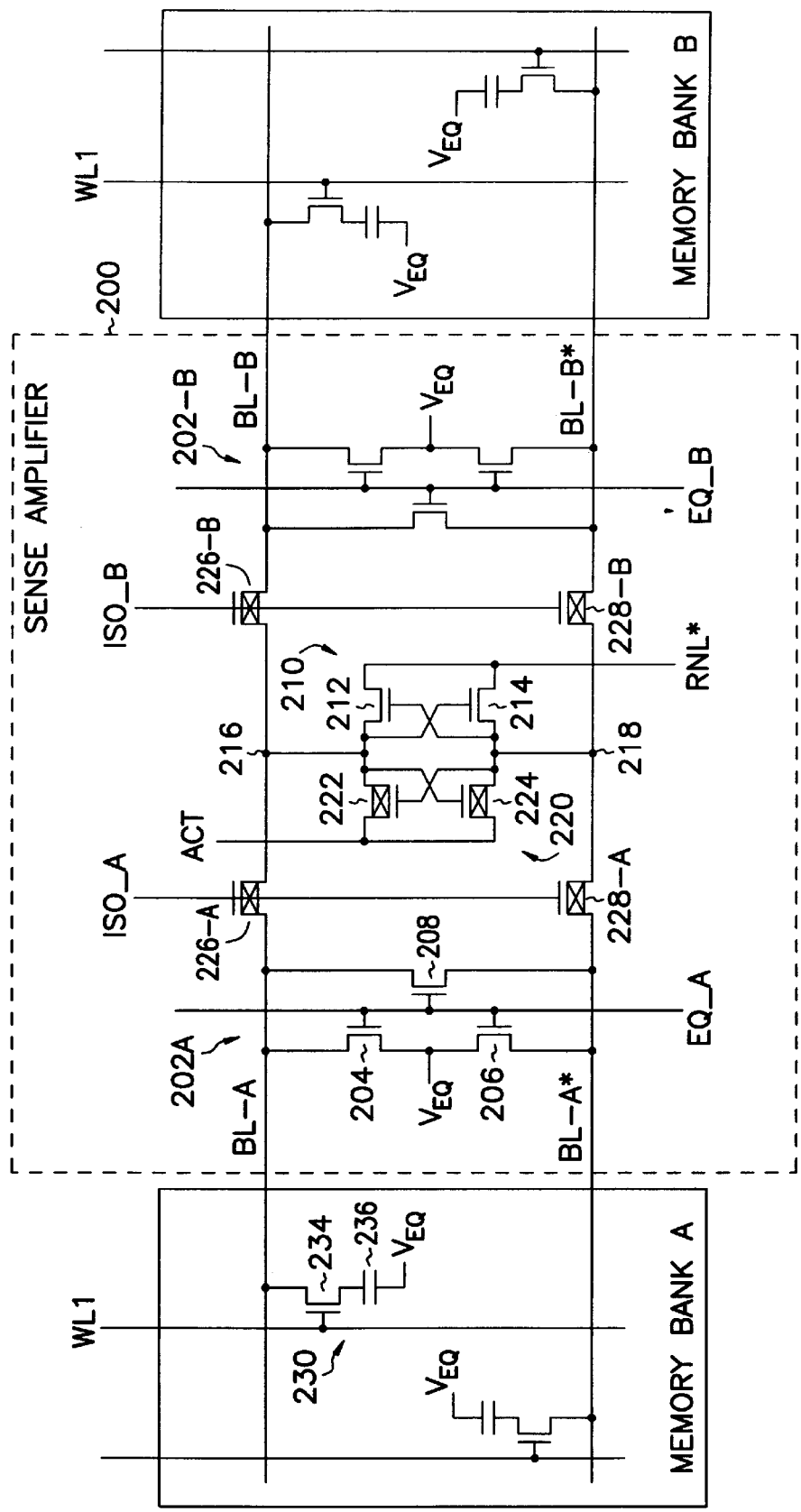

FIG. 2 is a schematic diagram of a sense amplifier, indicated generally at 200, that is coupled between memory bank A and memory bank B. Sense amplifier 200 includes first and second equilibration circuits 202-A and 202-B. Equilibration circuit 202-A includes transistors 204, 206 and 208. A gate of each transistor 204, 206 and 208 is coupled to receive a control signal labeled EQA. A first source/drain region of transistor 208 is coupled to bit line B1-A. A second source/drain region of transistor 208 is coupled to complementary bit line B1-A*. A first source/drain region of transistor 204 is coupled to bit line B1-A. A second source/drain region of transistor 204 is coupled to a reference voltage, $V_{EQ}$. Similarly, transistor 206 includes a first source/drain region coupled to the reference voltage and a second source/drain region coupled to complementary bit line B1-A*. In this case, the reference voltage $V_{EQ}$ is approximately halfway between the low and high logic values for the data stored in the cells of memory bank A and memory bank B. Assuming a power supply voltage of 2 volts, for example, $V_{EQ}$ may be on the order of 1.5 volts.

Sense amplifier 200 further includes n-sense amplifier 210. N-sense amplifier 210 includes transistors 212 and 214 that are n-channel transistors coupled in a cross-coupled configuration with a gate of transistor 214 coupled to node 216 and a gate of transistor 212 coupled to node 218. A common node of transistors 212 and 214 is coupled to a control signal RNL*.

Sense amplifier 200 further includes p-sense amplifier 220 that includes p-channel transistors 222 and 224. Transistors 222 and 224 are coupled in a cross-coupled configuration with a gate of transistor 224 coupled to node 216 and a gate of transistor 222 coupled to node 218. A common source/drain region of transistors 222 and 224 is coupled to a control signal labeled ACT.

Sense amplifier 200 further includes p-channel isolation transistors 226-A and 226-B that are coupled to bit line B1-A and bit line Bl-B, respectively. Specifically, a first source/drain region of transistor 226-A is coupled to bit line B1-A at memory bank A. Additionally, a second source/drain region of transistor 226-A is coupled to node 216. Similarly, the first source/drain region of transistor 226-B is coupled to bit line B1-B at memory bank B. Additionally, the second source/drain region of transistor 226-B is coupled to node 216.

Sense amplifier 200 further includes additional p-channel isolation transistors 228-A and 228-B. A first source/drain region of transistor 228-A is coupled to complementary bit line B1-A* of memory bank A. A second source drain region of transistor 228-A is coupled to node 218 along with a first source/drain region of transistor 228-B. Second source/drain region of transistor 228-B is coupled to complementary bit line B1-B* at memory bank B. A control signal labeled ISO__A is coupled to a gate of transistors 226-A and 228-A. A second control signal labeled ISO__B is coupled to a gate of transistors 226-B and 228-B.

Memory banks A and B each include a number of word lines WL and complementary bit line and bit line complement pairs (e.g., B1-A and B1-A* of memory bank A). Memory cells 230 are coupled to selected intersections of word line WL and bit line B1-A or B1-B or word line WL and bit line complement B1-A* or B1-B*. An exemplary memory cell is depicted in memory bank A and labeled with reference numeral 230. Memory cell 230 includes access transistor 234. Access transistor 234 includes a gate that is coupled to word line WL and a first source/drain region that is coupled to bit line B1-A. Additionally, a second source/drain region of transistor 234 is coupled to a first plate of capacitor 236. A second plate of capacitor 236 is coupled to a reference voltage, e.g., $V_{EQ}$.

In operation, sense amplifier 200 is used to read and write data to and from memory cells 230 of memory bank A and memory bank B. For example, to read data from memory cell 230 of memory bank A, EQ__A is brought to a low voltage level to turn off equilibration circuit 202-A. At this point, bit line B1-A and bit line complement B1-A* are equilibrated at $V_{EQ}$. Isolation transistors 226-A and 228-A are activated with a low voltage level on signal ISO__A so as to couple bit line B1-A to node 216 and bit line complement B1-A* to node 218, respectively. Isolation transistors 226-B and 228-B decouple bit line B1-B and bit line complement B1-B* of memory bank B from nodes 216 and 218, respectively, of sense amplifier 200 by raising the voltage of ISO__B to a high voltage level.

Word line WL is raised to a high voltage level to activate access transistor 234. When the voltage on word line WL is a threshold voltage, $V_t$, above the equilibrate voltage level of bit line B1-A, a charge stored on capacitor 236 is shared with bit line B1-A. In this example, the voltage of bit line B1-A is slightly elevated due to the high logic level stored on capacitor 236. Isolation transistor 226-A transfers this value to node 216.

Sense amplifiers 210 and 220 are activated to amplify the effect of the charge placed on bit line B1-A by capacitor 236. Initially, n-sense-amplifier 210 is activated by reducing the voltage of node RNL* to a low logic level. As the voltage difference between node 216 and RNL* approaches a threshold voltage of transistor 214, transistor 214 begins to conduct. Transistor 214 reduces the voltage on node 218 down to ground potential. The reduction in voltage on node 218 assures that transistor 212 will not conduct and thus does not affect the voltage at node 216.

After n-sense amplifier 210 fires, the control signal ACT is brought to a high voltage level to activate p-sense amplifier 220. In this example, the gate-to-source voltage on transistor 222 causes transistor 222 to conduct. By this operation, the high voltage level of the ACT signal is transmitted to node 216. Thus, the logic value stored in memory cell 230 is read out by sense amplifier 200.

Advantageously, by using p-channel transistors as isolation transistors, sense amplifier 200 provides a sheltering effect to allow better performance of n-sense amplifier 210 in a memory device with less than optimal bussing. This is due to the fact that p-channel isolation transistors 226-A, 226-B, 228-A and 228-B are more resistive for low bit line potentials than n-channel transistors. Further, this increased sensing ability consequently increases the initial access speed of sense amplifier 200.

When data is written back to a memory cell of, for example, memory bank A, the p-channel isolation transistors provide several distinct advantages over conventional memory devices. These advantages are illustrated in the following example in which a low logic value is written back to memory cell 230. Initially, n-sense amplifier 210 and p-sense amplifier 220 latch data onto complementary nodes 216 and 218. In the case of a low logic value being stored in memory cell 230, node 216 is latched to a low logic value of ground potential by n-sense amplifier 210 and node 218 is driven to a high logic value of approximately $V_{cc}$ by p-sense amplifier 220. P-channel isolation transistor 226-A passes the low logic value at node 216 to bit line B1-A. In doing so, isolation transistor 226-A raises the low logic value to a value of approximately 1 threshold voltage for p-channel transistor 226-A. This voltage is on the order of 0.7 to 1 volts. This voltage is stored by driving the voltage on word line WL to a high logic level so as to activate transistor 234 to pass the voltage from bit line B1-A to capacitor 236.

Advantageously, the translation of a low logic value from ground potential to approximately a threshold voltage of a p-channel transistor allows a memory device incorporating sense amplifier 200 and memory banks A and B to operate at a reduced power supply level in a more efficient manner than conventional DRAM circuits. The value of the low logic value for the memory cells affects the equilibration voltage of sense amplifier 200 since the equilibration voltage is one-half of the difference between a low logic level and a high logic level for the memory cells. In turn, the equilibration voltage is the voltage that is applied to the gate of the n-channel transistors in the n-sense amplifier to turn it on. Thus, the equilibration voltage needs to be high enough so as to be at least a threshold voltage above the voltage at the source of the transistors of the n-sense amplifier initially, so as to turn on the transistors. Otherwise, the n-sense amplifier will not operate properly. By lowering the high logic voltage for the memory cells in memory banks A and B, the equilibration voltage is also lowered. However, by using a p-channel isolation transistor, the low logic voltage is raised and so the equilibration voltage is also higher for a given high logic level or power supply voltage. Thus, a memory device according to the teachings of the present invention that uses a different voltage swing on a memory cell as compared to the voltage swing in a sense amplifier will operate more effectively at lower power supply voltages.

Further advantages of using p-channel transistors as isolation devices include that a high bit line is restored through a low resistance path, opposite of n-channel isolation gates. This reduces the time to restore the high logic level in a write cycle, while hurting the restore of the low logic level. Since the primary concern in DRAM design is the refresh of high logic levels, the use of p-channel isolation transistors provides better results than the conventional n-channel transistors. Additionally, the gate voltage of the p-channel isolation transistors can be manipulated to prohibit a low bit line from going all the way to ground until needed. This dramatically reduces the amount of refresh degradation through sub-threshold voltage leakage.

Conclusion

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, the threshold voltage for the p-channel isolation transistors can be varied from the 0.7 to 1 volt range as needed in a specific application. Further, the p-channel isolation transistors can be used to establish the low logic level of the memory banks during write operations, restore operations, or both.

What is claimed is:

1. A memory device, comprising:
   first and second sub-arrays of memory cells, each sub-array including a number of bit lines and a number of word lines with memory cells located at selected intersections of the bit and word lines;
   a sense amplifier, including at least a portion of which is shared by the first and second sub-arrays;
   a number of p-channel isolation transistors, each coupled to a bit line and a node of a shared sense amplifier;
   an equilibration circuit associated with each pair of complementary bit lines that establishes an equilibration voltage that is greater than half of a power supply voltage for the memory device, and
   wherein the p-channel isolation transistors are controlled to establish a low logic level on the bit line at a voltage that limits the swing on the bit lines.

2. The memory device of claim 1, wherein the p-channel isolation transistors each include a gate that is coupled to receive a control signal, wherein high and low logic of the control signal decouple and couple, respectively, bit lines to nodes of the sense amplifier.

3. The memory device of claim 1, wherein the equilibration circuit equilibrates the voltage of the complementary bit lines at a level that is approximately halfway between the high and low logic values for the memory cells.

4. An apparatus, comprising:
   an electronic system;
   a memory device coupled to the electronic system for storing data; and
   wherein the memory device includes first and second sub-arrays that are coupled to a sense amplifier with p-channel isolation transistors such that the p-channel isolation transistors are controlled to establish a low logic level for the sub-arrays at a voltage that limits the swing on bit lines of the sub-arrays and that establishes an equilibration voltage that is greater than one half of the power supply voltage of the memory device such that the memory device can operate at lower power supply voltages compared to conventional memory devices.

5. The apparatus of claim 4, wherein the electronic system comprises a processor based computer.

6. The apparatus of claim 4, wherein the p-channel isolation transistors are coupled between complementary nodes of the sense amplifier and complementary bit lines.

7. The apparatus of claim 4, wherein the memory device further includes an equilibration circuit coupled between complementary bit lines that equilibrates the voltage of the complementary bit lines at a level that is approximately halfway between the high and low logic values for the sub-arrays.

8. The apparatus of claim 4, wherein the p-channel isolation transistors each include a gate that is coupled to receive a control signal, wherein high and low logic of the control signal decouple and couple, respectively, bit lines to nodes of the sense amplifier.

9. The apparatus of claim 4, wherein the p-channel transistors are controlled to pass a high logic level to the sub-array from the sense amplifier with substantial change to the voltage level of the high logic level.

10. A method for limiting voltage swing on the complementary bit lines of a memory device, comprising:
   coupling complementary bit lines of the memory device to a sense amplifier through first and second p-channel isolation devices;
   equilibrating the complimentary bit lines at a voltage level that is greater than one half of a power supply voltage for the memory device; and
   applying a low voltage to a gate of the p-channel isolation devices to activate the p-channel isolation devices such that one of the first and second p-channel isolation devices establishes the low logic level on one of the complementary bit lines at a voltage that limits the swing on the complementary bit lines.

11. The method of claim 10, and further comprising decoupling a complementary pair of bit lines form the sense amplifier through third and fourth p-channel isolation devices such that first and second sub-arrays share at least a portion of the sense amplifier.

12. The method of claim 10, and further comprising applying a high voltage to a gate of the p-channel isolation devices to deactivate the p-channel isolation devices when a second set of complementary bit lines use the sense amplifier.

13. A method for reading and writing data in a memory device having first and second sub-arrays and a shared sense amplifier, the method comprising:

isolating one of the first and second sub-arrays from the sense amplifier with a first pair of p-channel isolation transistors coupled between complementary bit lines and the sense amplifier;

coupling the other of the first and second sub-arrays to the sense amplifier with a second pair of p-channel isolation transistors coupled between complementary bit lines and the sense amplifier;

selectively reading and writing data to and from selected cells through the p-channel isolation transistors coupled to the non-isolated sub-array using an equilibration voltage that is greater than one half of the power supply voltage; and establishing a low logic level on one of the bit lines of the non-isolated sub-array that is different from the low logic level of the sense amplifier.

14. The method of claim 13, wherein establishing a low logic level comprises converting the low logic level of the sense amplifier with one of the p-channel isolation transistors.

15. The method of claim 13, wherein isolating one of the first and second sub-arrays comprises applying a high voltage level to a gate of the first pair of p-channel isolation transistors.

16. The method of claim 13, wherein coupling the other of the first and second sub-arrays comprises applying a low voltage level to a gate of the second pair of p-channel isolation transistors.

17. The method of claim 13, wherein establishing a low logic level comprises establishing a logic level that is above the low logic level of the sense amplifier by approximately a threshold voltage of the p-channel isolation transistor.

18. A method for reading data from a cell of a memory device, comprising:

equilibrating the voltage on a pair of complementary bit lines of an array of the memory device to a voltage level that is approximately half of the difference between low and high logic levels for the memory cell;

activating an access transistor of a selected memory cell of the array to share charge with a bit line of the complementary pair;

passing the voltages from the complementary bit lines through p-channel isolation transistors to a sense amplifier;

applying control signals to the sense amplifier so as to amplify the effect of the charge shared with the bit line such that complementary nodes of the sense amplifier are driven to high and low logic levels based on the data stored in the selected cell; and wherein the low logic level for the complementary bit lines is different from the low logic level for the sense amplifier so as to allow a higher equilibration voltage for a given power supply voltage.

19. A method for establishing a low logic level for a cell of a memory device, the method comprising:

driving complementary nodes of a sense amplifier to high and low logic levels based on the data for the cell so as to latch the data;

coupling the nodes of the sense amplifier to the bit lines through first and second p-channel transistors;

converting the low logic level of the sense amplifier to a different, higher voltage level for the bit lines of the memory device using the p-channel transistors such that the bit lines are equilibrated to a voltage above the midpoint between the high and low logic levels of the sense amplifier so as to provide a higher drive voltage for the sense amplifier for a given power supply voltage.

20. The method of claim 19, and further comprising passing the high logic level from the sense amplifier to the bit lines without substantial change in the voltage of the high logic level.

* * * * *